United States Patent
Minamihaba et al.

(10) Patent No.: US 8,575,030 B2
(45) Date of Patent: Nov. 5, 2013

(54) SEMICONDUCTOR DEVICE MANUFACTURING METHOD

(75) Inventors: Gaku Minamihaba, Yokohama (JP);
Yukiteru Matsui, Yokohama (JP);
Nobuyuki Kurashima, Yokohoma (JP);
Hajime Eda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 143 days.

(21) Appl. No.: 13/196,594

(22) Filed: Aug. 2, 2011

(65) Prior Publication Data
US 2012/0034846 A1 Feb. 9, 2012

(30) Foreign Application Priority Data

Aug. 4, 2010 (JP) .................................. 2010-175692
Mar. 18, 2011 (JP) .................................. 2011-061559

(51) Int. Cl.
*H01L 21/302* (2006.01)

(52) U.S. Cl.
USPC ...... 438/692; 438/689; 438/690; 257/E21.23; 257/692

(58) Field of Classification Search
USPC ............. 438/689, 690, 892; 257/E21.23, 692
See application file for complete search history.

(56) References Cited

U.S. PATENT DOCUMENTS

| | | | | |
|---|---|---|---|---|
| 4,450,652 A | * | 5/1984 | Walsh | 451/7 |
| 8,222,144 B2 | * | 7/2012 | Kamikubo et al. | 438/692 |
| 2004/0186206 A1 | * | 9/2004 | Yoneda et al. | 524/95 |
| 2007/0049166 A1 | * | 3/2007 | Yamaguchi et al. | 451/5 |
| 2007/0082456 A1 | * | 4/2007 | Uotani et al. | 438/427 |

FOREIGN PATENT DOCUMENTS

| | | |
|---|---|---|
| JP | 2007-95945 | 4/2007 |
| JP | 2008-60460 | 3/2008 |
| JP | 2008-166448 | 7/2008 |

* cited by examiner

*Primary Examiner* — Duy Deo
*Assistant Examiner* — Maki Angadi
(74) *Attorney, Agent, or Firm* — Finnegan, Henderson, Farabow, Garrett & Dunner, LLP

(57) ABSTRACT

According to one embodiment, a semiconductor device manufacturing method is disclosed. The method can include polishing a film on a semiconductor substrate by pressing the film against a polishing pad. Polishing the film comprises performing first polishing in which an entrance temperature of the polishing pad is adjusted to 40° C. (inclusive) to 50° C. (inclusive), and an exit temperature of the polishing pad is adjusted to be higher by 5° C. or more than the entrance temperature. Polishing the film comprises performing second polishing in which the entrance temperature is adjusted to 30° C. or less, and the exit temperature is adjusted to be higher by 5° C. or more than the entrance temperature.

20 Claims, 11 Drawing Sheets

| Experiment No. | 1 | 2 | 3 | 4 | 5 | 6 | 7 | 8 | 9 | 10 | 11 |
|---|---|---|---|---|---|---|---|---|---|---|---|
| Polishing cloth entrance temperature (°C) | 60 | 60 | 50 | 50 | 40 | 40 | 30 | 30 | 21 | 21 | 40 |
| Polishing cloth exit temperature (°C) | 58 | 64 | 52 | 55 | 43 | 45 | 33.5 | 36 | 24 | 31 | 43 |
| Exit temperature - entrance temperature (°C) | -2 | 4 | 2 | 5 | 3 | 5 | 3.5 | 6 | 3 | 10 | 3 |
| Cu dishing | X | X | X | X | X | X | X | ◯ | X | ◯ | ◯ |
| Corrosion | X | X | X | X | X | X | X | ◯ | X | ◯ | ◯ |
| Dust | X | X | X | X | X | X | X | ◯ | X | ◯ | X |
| Scratch | X | X | X | X | X | X | X | ◯ | X | ◯ | X |
| Cu residue | X | X | X | X | X | X | X | ◯ | X | ◯ | X |

| Experiment No. | 12 | 13 | 14 | 15 | 16 | 17 | 18 | 19 | 20 | 21 | 22 |
|---|---|---|---|---|---|---|---|---|---|---|---|
| Polishing cloth entrance temperature (°C) | 60 | 60 | 50 | 50 | 40 | 40 | 30 | 30 | 21 | 21 | 51 |
| Polishing cloth exit temperature (°C) | 58 | 66 | 52 | 55.5 | 43 | 47 | 34 | 40 | 25 | 32 | 53 |
| Exit temperature - entrance temperature (°C) | -2 | 6 | 2 | 5.5 | 3 | 7 | 4 | 10 | 4 | 12 | 2 |
| Cu film removal time as productivity | × | × | × | ○ | × | ○ | × | × | × | × | × |

FIG. 5

| Experiment No. | 23 | | 24 | | 25 | | 8 |
|---|---|---|---|---|---|---|---|
| Polishing cloth entrance temperature (°C) | 40 | 28 | 40 | 29 | 40 | 30 | 30 |
| Polishing cloth exit temperature (°C) | 46 | 35 | 46 | 35 | 46 | 35 | 36 |
| Exit temperature - entrance temperature (°C) | 6 | 7 | 6 | 6 | 6 | 5 | 6 |
| Residual Cu film for switching (nm) | 70 | - | 50 | - | 30 | - | - |
| Cu dishing | - | ○ | - | ○ | - | × | ○ |
| Corrosion | - | ○ | - | ○ | - | ○ | ○ |
| Dust | - | ○ | - | ○ | - | ○ | ○ |
| Scratch | - | ○ | - | ○ | - | × | ○ |
| Cu residue | - | ○ | - | ○ | - | × | ○ |
| Cu film removal time as productivity | - | ○ | - | ○ | - | ○ | × |

FIG. 6

| Experiment No. | 23' | | 24' | | 25' | | 8' |
|---|---|---|---|---|---|---|---|
| Polishing cloth entrance temperature (°C) | 40 | 28 | 40 | 29 | 40 | 30 | 30 |
| Polishing cloth exit temperature (°C) | 47 | 38 | 48 | 37 | 48 | 35 | 37 |
| Exit temperature - entrance temperature (°C) | 7 | 10 | 8 | 8 | 8 | 5 | 7 |
| Residual W film for switching | 70 | - | 50 | - | 30 | - | - |
| W dishing | - | ○ | - | ○ | - | × | ○ |
| Corrosion | - | ○ | - | ○ | - | ○ | ○ |
| Dust | - | ○ | - | ○ | - | × | ○ |
| Scratch | - | ○ | - | ○ | - | × | ○ |
| W residue | - | ○ | - | ○ | - | ○ | ○ |
| W film removal time as productivity | - | ○ | - | ○ | - | ○ | × |
FIG. 7
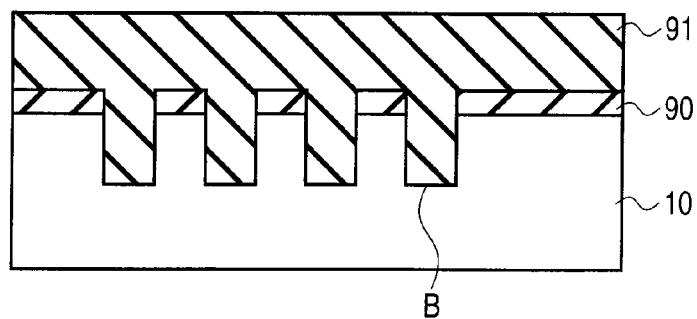
FIG. 8A
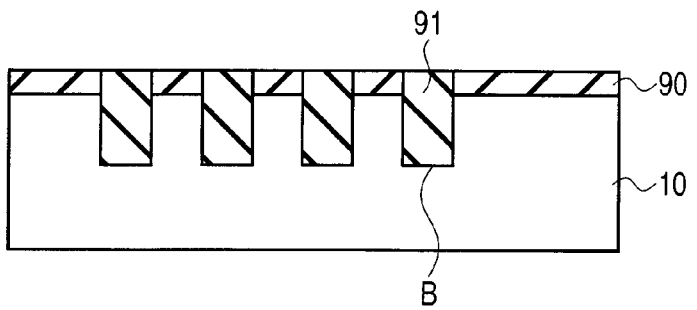
FIG. 8B

| Experiment No. | 27 | 26 | |
|---|---|---|---|
| Polishing cloth entrance temperature (°C) | 40 | 28 | 42 |
| Polishing cloth exit temperature (°C) | 48 | 38 | 45 |
| Exit temperature - entrance temperature (°C) | 8 | 10 | 3 |
| Residual oxide film for switching (nm) | 70 | - | - |
| Oxide dishing | - | ○ | × |
| Dust | - | ○ | ○ |
| Scratch | - | ○ | ○ |
| Oxide film removal time as productivity | - | ○ | × |

F I G. 9

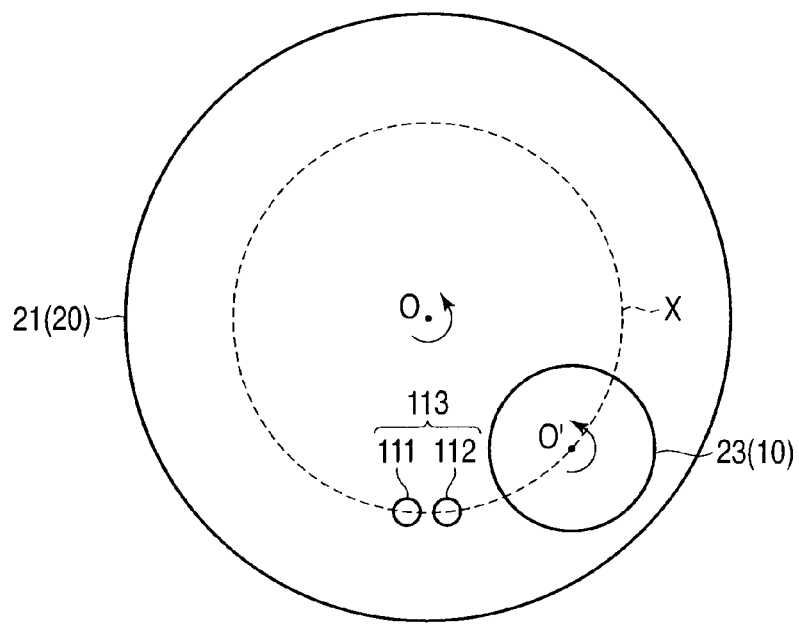
F I G. 11
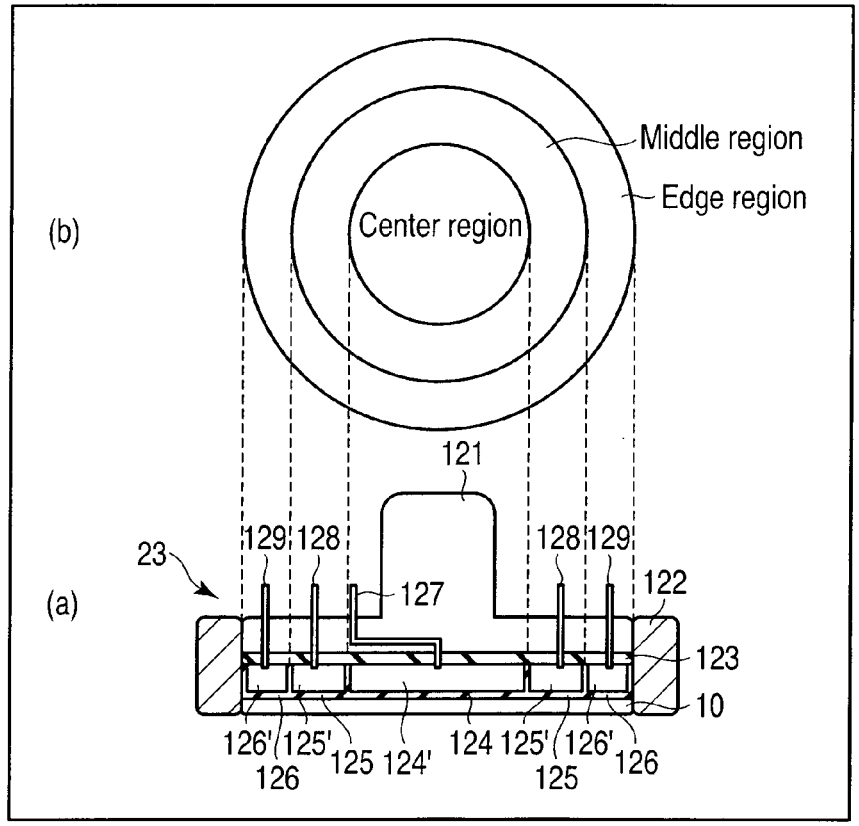
F I G. 12

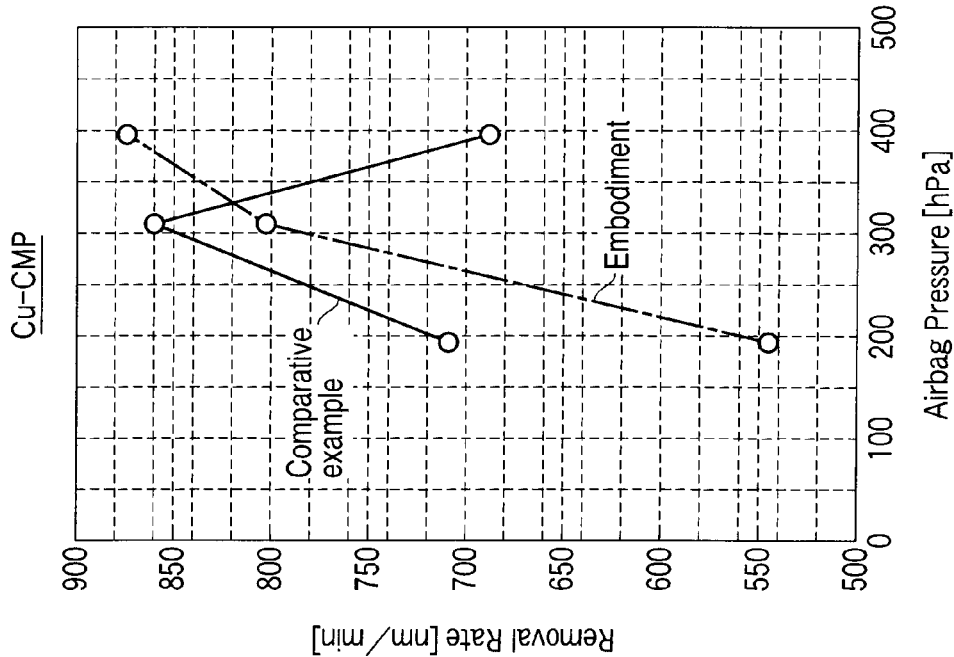
F I G. 16B
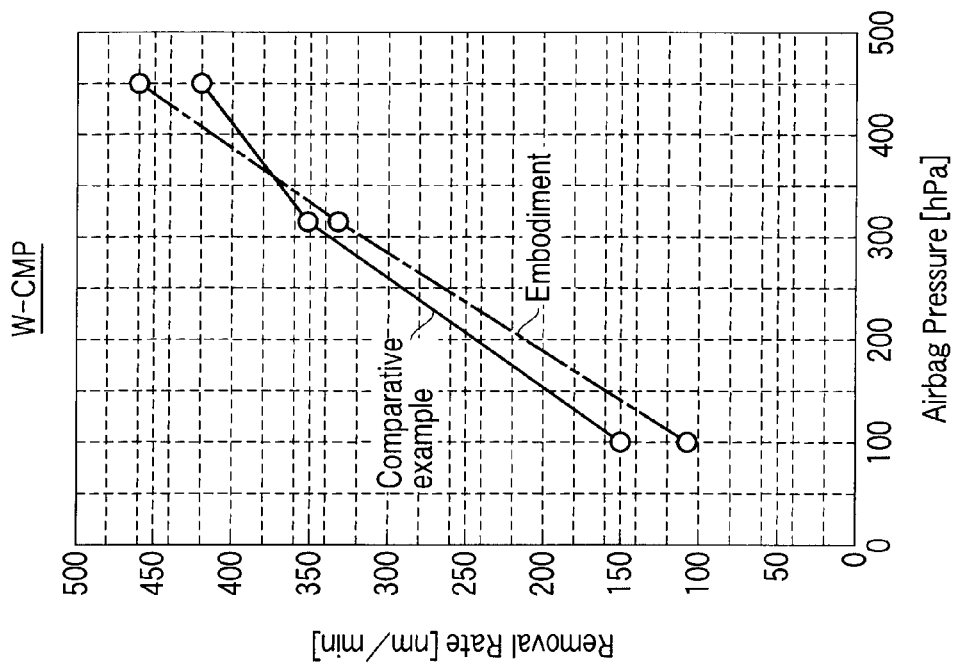
F I G. 16A

SEMICONDUCTOR DEVICE MANUFACTURING METHOD

CROSS-REFERENCE TO RELATED APPLICATIONS

This application is based upon and claims the benefit of priority from Japanese Patent Applications No. 2010-175692, filed Aug. 4, 2010; and No. 2011-061559, filed Mar. 18, 2011; the entire contents of both of which are incorporated herein by reference.

FIELD

Embodiments described herein relate generally to a semiconductor device manufacturing method.

BACKGROUND

Recently, micropatterned damascene interconnections and contact plugs mainly containing Cu are formed by using CMP (Chemical Mechanical Polishing). However, the CMP process is more expensive than other semiconductor manufacturing steps. Therefore, it is important to reduce the cost of the CMP process.

In particular, a slurry (polishing solution) occupies most of the cost of the CMP process. Reducing the supply amount of the slurry is an example of a method of reducing the cost of the slurry. However, the CMP characteristics deteriorate if the supply amount of the slurry is reduced. That is, the cost reduction and the improvement of the CMP characteristics have a tradeoff relationship.

More specifically, the following problems arise when performing CMP by reducing the slurry supply amount.

When forming, e.g., a micropatterned damascene interconnection by performing CMP on a thin Cu film (e.g., 400 nm), Cu dishing, corrosion, dust, scratch, the Cu residue, and the like increase. That is, the CMP characteristics deteriorate.

Also, when forming, e.g., a contact plug (TSV: Through Silicon Via) by performing CMP on a thick Cu film (e.g., 1 to 3 µm), the polishing time prolongs. That is, even when the supply amount of the slurry is reduced, the use amount of the slurry increases, and the cost increases.

Accordingly, demands have arisen for a method that reduces the cost by efficiently using an expensive slurry, and improves the CMP characteristics.

BRIEF DESCRIPTION OF THE DRAWINGS

FIG. 5 is a view showing the results of polishing experiments according to the second embodiment;

FIG. 6 is a view showing the results of polishing experiments according to the third embodiment;

FIG. 7 is a view showing the results of polishing experiments according to the fourth embodiment;

FIG. 8A is a sectional view showing a semiconductor device manufacturing step according to the fifth embodiment;

FIG. 8B is a sectional view showing a semiconductor device manufacturing step according to the fifth embodiment, which follows FIG. 8A;

FIG. 9 is a view showing the results of polishing experiments according to the fifth embodiment;

FIG. 11 is a plan view showing the CMP apparatus according to the sixth embodiment;

FIG. 12 is a view showing a top ring according to the sixth embodiment;

FIG. 16A is a graph showing the relationship between the polishing rate and the polishing load in CMP of a W film according to the sixth embodiment and its comparative example; and FIG. 16B is a graph showing the relationship between the polishing rate and the polishing load in CMP of a Cu film according to the sixth embodiment and its comparative example.

DETAILED DESCRIPTION

Figure 1A:
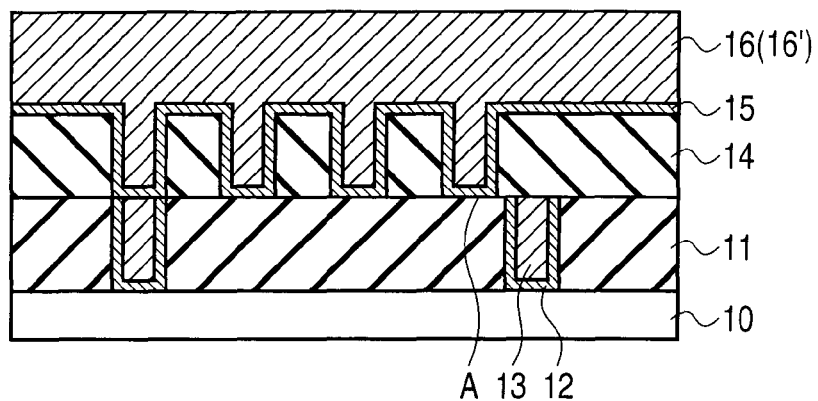
FIG. 1A is a sectional view showing a semiconductor device manufacturing step according to the first embodiment.

In general, according to one embodiment, a semiconductor device manufacturing method is disclosed. The method can include polishing a film on a semiconductor substrate by pressing the film against a polishing pad. Polishing the film comprises performing first polishing in which an entrance temperature of the polishing pad is adjusted to 40° C. (inclusive) to 50° C. (inclusive), and an exit temperature of the polishing pad is adjusted to be higher by 5° C. or more than the entrance temperature. Polishing the film comprises performing second polishing in which the entrance temperature is adjusted to 30° C. or less, and the exit temperature is adjusted to be higher by 5° C. or more than the entrance temperature.

Embodiments will be explained below with reference to the accompanying drawing. In the drawing, the same reference numerals denote the same parts.

<First Embodiment>

A semiconductor device manufacturing method according to the first embodiment will be explained below with reference to FIGS. 1A, 1B, 10, 2A, 2B, 3, and 4.

[Interconnection Structure Manufacturing Method]

Figure 1B:
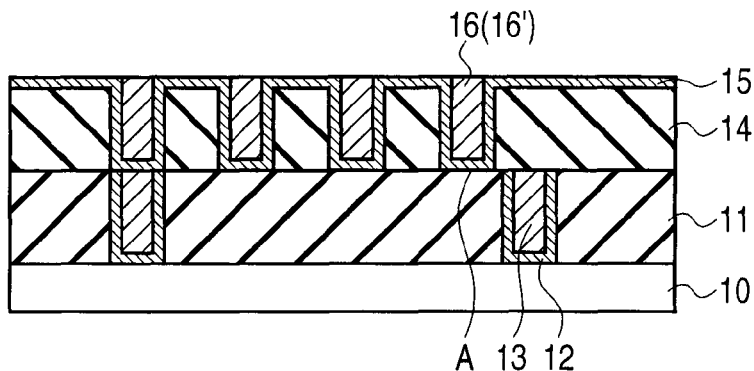
FIG. 1B is a sectional view showing a semiconductor device manufacturing step according to the first embodiment, which follows FIG. 1A.
Figure 1C:
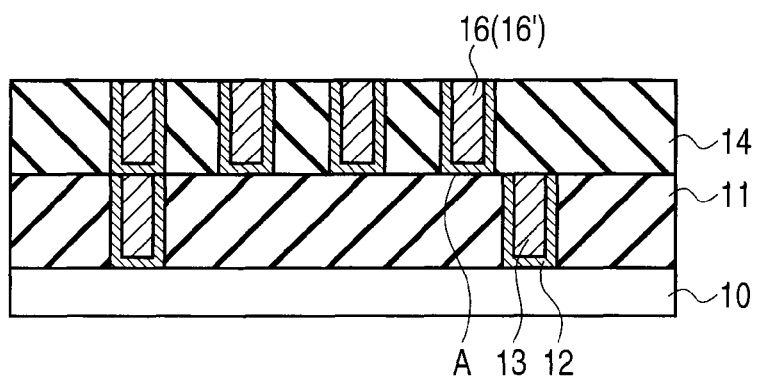
FIG. 1C is a sectional view showing a semiconductor device manufacturing step according to the first embodiment, which follows FIG. 1B.

FIGS. 1A, 1B, and 1C illustrate the steps of manufacturing an interconnection structure of a semiconductor device according to this embodiment.

First, as shown in FIG. 1A, an insulating film 11 is formed on a semiconductor substrate 10 in which a semiconductor element (not shown) is formed. The insulating film 11 is made of, e.g., $SiO_2$. Contact holes are formed in the insulating film 11, and a contact plug 13 is formed on a barrier metal 12 formed in each contact hole. The barrier metal 12 is made of, e.g., TiN. The contact plug 13 is made of, e.g., W. In this way, a contact layer including the insulating film 11, barrier metals 12, and contact plugs 13 is formed.

Then, an insulating film 14 is formed on the contact layer. The insulating film 14 is made of, e.g., $SiO_2$. Interconnection trenches A as recesses are formed in the insulating film 14. Each interconnection trench A is formed as a micropatterned interconnection having, e.g., a width of 20 nm and a coverage of 50%. Subsequently, a barrier metal 15 is formed on the entire surface by a conventional method (e.g., CVD). The barrier metal 15 is made of, e.g., Ti, and has a thickness of 5 nm. After that, a Cu film 16 as an interconnection is formed on the entire surface by a conventional method (e.g., CVD). In this step, the Cu film 16 is also formed outside the interconnection trenches A, and has a thickness of 400 nm.

Then, CMP is performed on the entire surface. In this CMP, (A) polishing and (B) polishing are performed.

More specifically, as shown in FIG. 1B, an extra Cu film 16 formed outside the interconnection trenches A is removed in the (A) polishing. Consequently, the Cu film 16 is buried in the interconnection trenches A. Also, the surface of the barrier metal 15 is exposed outside the interconnection trenches A.

After that, as shown in FIG. 1C, the barrier metal 15 formed outside the interconnection trenches A is removed in the (B) polishing (touchup). As a consequence, the surface of the insulating film 14 is exposed outside the interconnection trench A. In this step, the surface of the insulating film 14 is also partially removed. In addition, the Cu residue (to be described later) must completely be removed from the surface of the insulating film 14 outside the interconnection trenches A. In this manner, an interconnection layer including the insulating film 14, barrier metal 15, and Cu film 16 is formed. Details of CMP will be described later.

[CMP Apparatus]

Figure 2A:
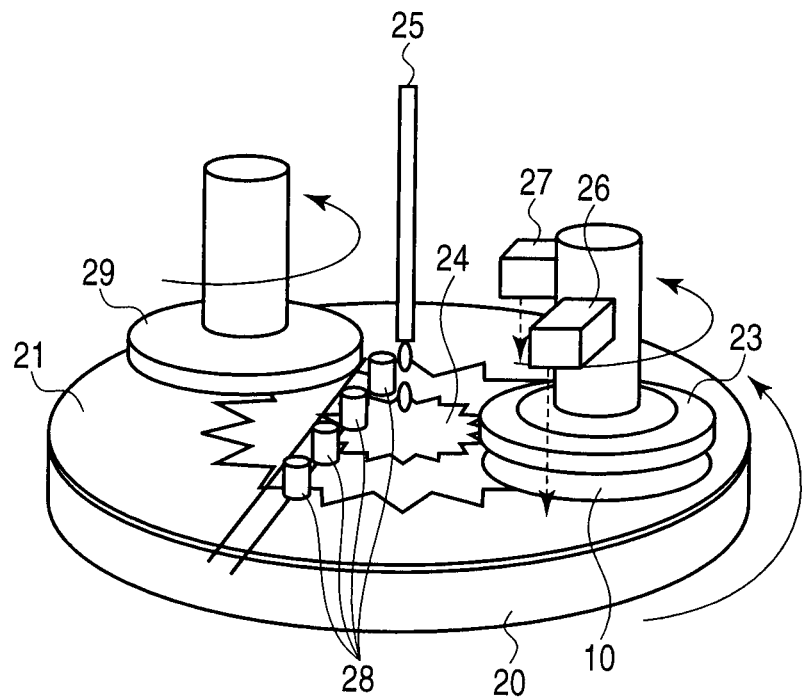
FIG. 2A is a view showing the arrangement of a CMP apparatus according to the first embodiment.
Figure 2B:
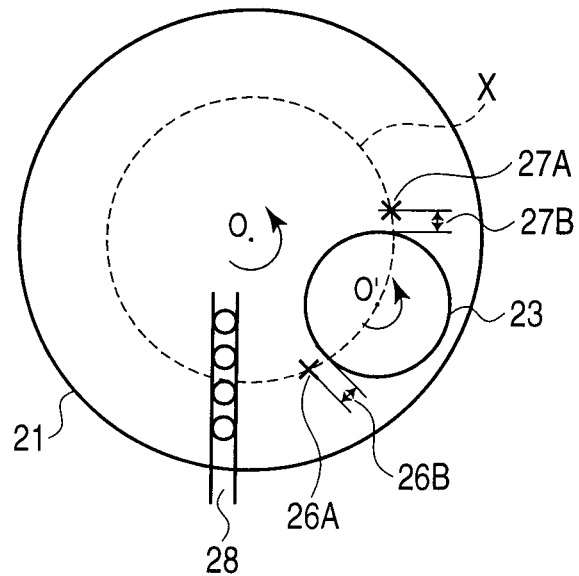
FIG. 2B is a plan view showing the CMP apparatus according to the first embodiment.

FIG. 2A is a view showing the arrangement of a CMP apparatus according to this embodiment. FIG. 2B is a plan view of the CMP apparatus according to this embodiment.

As shown in FIG. 2A, the CMP apparatus according to this embodiment includes a turntable 20, polishing pad 21, a top ring 23, a slurry supply nozzle 25, cooling nozzles 28, and a dresser 29.

The top ring 23 holding the semiconductor substrate 10 is pressed against the polishing pad 21 adhered on the turntable 20. A metal film (the Cu film 16 shown in FIG. 1A) as a film to be processed is formed on the semiconductor substrate 10. The turntable 20 is rotatable at 1 to 200 rpm. The top ring 23 is rotatable at 1 to 200 rpm. The turntable 20 and top ring 23 rotate in the same direction, e.g., counterclockwise. Also, the turntable 20 and top ring 23 rotate in a predetermined direction during CMP. The polishing load of the turntable 20 and top ring 23 is normally about 50 to 500 hPa. In addition, a column member connected to the top ring 23 has an entrance temperature measurement device 26 and exit temperature measurement device 27 as infrared radiation thermometers. Details of the entrance temperature measurement device 26 and exit temperature measurement device 27 will be described later.

The slurry supply nozzle 25 is positioned above the polishing pad 21. The slurry supply nozzle 25 can supply a predetermined liquid chemical as a slurry 24 at a flow rate of 50 to 500 cc/min. The slurry supply nozzle 25 is located near a center O of the turntable 20 shown in, e.g., FIG. 2B. However, the present invention is not limited to this, and the slurry supply nozzle 25 may appropriately be located so as to supply the slurry 24 onto the entire surface of the polishing pad 21.

Furthermore, the cooling nozzles 28 for spraying compressed air, nitrogen gas, or the like against the polishing pad 21 are positioned above the polishing pad 21. The cooling nozzles 28 are arranged on the radius of the polishing clock 21 from the slurry supply nozzle 25 (the rotating shaft of the turntable 20) as a center, and hence can spray compressed air or the like against the entire surface of the polishing pad 21 when it is rotated. The cooling nozzles 28 spray compressed air against the polishing pad 21 at about 0 to 1,000 l/min. Also, the cooling nozzles 28 are arranged upstream of the entrance temperature measurement device 26 in the rotational direction of the turntable 20. Accordingly, the entrance temperature measured by the entrance temperature measurement device 26 can be adjusted by controlling the cooling nozzles 28.

As shown in FIG. 2B, the entrance temperature measurement device 26 is positioned upstream of the top ring 23 (semiconductor substrate 10) in the rotational direction of the turntable 20. Therefore, the entrance temperature measurement device 26 measures the surface temperature (entrance temperature) of the polishing pad 21 on the upstream side of the top ring 23 in the rotational direction of the turntable 20. That is, the entrance temperature measurement device 26 measures the surface temperature of the polishing pad 21 before it touches the top ring 23.

On the other hand, the exit temperature measurement device 27 is positioned downstream of the top ring 23 in the rotational direction of the turntable 20. Therefore, the exit temperature measurement device 27 measures the surface temperature (exit temperature) of the polishing pad 21 on the downstream side of the top ring 23 in the rotational direction of the turntable 20. That is, the exit temperature measurement device 27 measures the surface temperature (exit temperature) of the polishing pad 21 after it touches the top ring 23.

The entrance temperature measurement device 26 and exit temperature measurement device 27 each measure the temperature of the polishing pad 21 on a circular orbit X passing through a center O' of the top ring 23, and having a predetermined distance from the center O (rotating shaft) of the turntable 20. This is so because the semiconductor substrate 10 and polishing pad 21 are in contact with each other for a long time on the circular orbit X, and hence a maximum temperature can be measured.

In the vicinity of the edge of the top ring 23, the slurry 24 runs against the top ring 23 and rises. If the temperature is measured near the edge of the top ring 23, therefore, the entrance temperature measurement device 26 and exit temperature measurement device 27 may measure the temperature of the slurry, instead of the surface temperature of the polishing pad 21, by mistake. To measure the surface temperature of the polishing pad 21, the entrance temperature measurement device 26 desirably measures the temperature at an entrance temperature measurement point 26A located on the circular orbit X and spaced apart by a distance 26B (e.g., 10 mm) from the top ring 23. Similarly, the exit temperature measurement device 27 desirably measures the temperature at an exit temperature measurement point 27A located on the circular orbit X and spaced apart by a distance 27B (e.g., 10 mm) from the top ring 23.

Note that FIG. 2A shows the dresser 29 for conditioning the surface of the polishing pad 21. The dresser 29 is normally rotated at 1 to 200 rpm, and pressed against the polishing pad 21 with a load of 50 to 500 hPa.

[CMP Conditions]

The CMP conditions of this embodiment are applicable to, e.g., a case in which, when forming an interconnection structure, a barrier metal made of Ti is deposited by about 5 nm, and a Cu film as an interconnection is deposited by about 400 nm. More specifically, the CMP conditions are applied when forming a micropatterned damascene interconnection in, e.g., a memory. Note that the barrier metal is not limited to Ti, and may also be Ta, V, Nb, Ru, Co, Mo, or W, or a compound or multilayered film of these elements. Note also that the interconnection is not limited to a Cu film, and may also be an alloy mainly containing Cu.

In CMP according to this embodiment, while the turntable 20 on which the polishing pad 21 is adhered is rotated at 100 rpm, the top ring 23 holding the semiconductor substrate 10 having a diameter of 300 mm is pressed against the polishing pad 21 with a polishing load of 320 gf/cm$^2$. In this step, the top ring 23 is rotated at 102 rpm. In addition, the slurry supply nozzle 25 supplies the slurry 24 onto the polishing pad 21 at a flow rate of 150 cc/min.

Note that a polishing load of 320 gf/cm$^2$ of this embodiment is higher than the polishing load (180 gf/cm$^2$) of normal CMP conditions. Note also that a flow rate of 150 cc/min of the slurry 24 of this embodiment is lower than the flow rate (300 cc/min) of the normal CMP conditions. A flow rate of 150 cc/min is a flow rate at which the CMP characteristics deteriorate.

In this embodiment, CMP is performed by adjusting the entrance temperature and exit temperature of the polishing pad 21 measured by the entrance temperature measurement device 26 and exit temperature measurement device 27. More specifically, the adjustment is performed such that the entrance temperature is 30° C. or less, and the exit temperature is higher by 5° C. or more than the entrance temperature. The entrance temperature is adjusted by controlling the cooling nozzles 28. That is, the temperature of the polishing pad 21 tends to rise during CMP due to friction or the like, but the entrance temperature can be held constant by cooling the polishing pad 21 by using the cooling nozzles 28. Also, the exit temperature is adjusted by controlling the polishing load and flow rate. For example, the exit temperature rises when the polishing load is increased.

That is, in this embodiment, the entrance temperature is adjusted to 30° C. or less by controlling the cooling nozzles 28, and the exit temperature is adjusted to be higher by 5° C. or more than the entrance temperature by controlling the polishing load to 320 gf/cm$^2$ and the flow rate to 150 cc/min. Note that from the viewpoint of productivity, the polishing load is desirably as high as possible, and the exit temperature is desirably adjusted to be higher by 10° C. or more than the entrance temperature.

The CMP conditions of this embodiment are applicable to the (A) polishing of CMP.

In the (A) polishing, the slurry 24 is obtained by a solution mixture of ammonium persulfate (2 wt %), and CMS7501 containing a component that chemically forms a film to be polished on the surface of a Cu film and CMS7552 (available from JSR) containing silica that mechanically removes the film to be polished.

Note that the CMP conditions of this embodiment are applicable not only to the (A) polishing but also to the (B) polishing.

[Polishing Experiments]

Polishing experiments as the bases of the CMP conditions of this embodiment will be described below.

With the Cu film 16 being formed by about 400 nm, polishing experiments were conducted by setting the flow rate of the slurry 24 at 150 cc/min, and changing the entrance and exit temperatures. More specifically, the polishing experiments were conducted by adjusting the entrance temperature to 21° C., 30° C., 40° C., 50° C., and 60° C., and adjusting the exit temperature to be higher by 5° C. or more or by less than 5° C. than the entrance temperature.

Figures 3, 4:
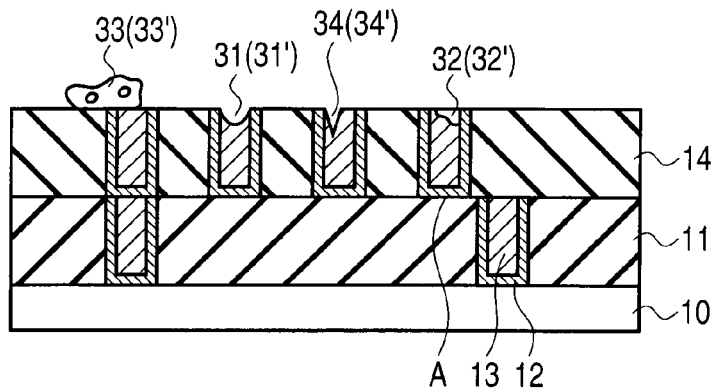
FIG. 3 is a sectional view showing a semiconductor device according to the first embodiment after CMP is performed.
FIG. 4 is a view showing the results of polishing experiments according to the first embodiment.

FIG. 3 is a sectional view of an interconnection structure after CMP (touchup). As shown in FIG. 3, Cu dishing 31, corrosion 32, dust 33, and scratch 34 occur on the Cu film 16 after CMP. These defects degrade the interconnection characteristics.

In addition, although not shown, a Cu residue forms on the insulating film 14 after the (A) polishing. Touchup is performed to remove this Cu residue, and the touchup amount is desirably as small as possible. Furthermore, a Cu residue sometimes forms even after touchup, and this Cu residue may shortcircuit the interconnection.

In the polishing experiments, the slurry 24 for touchup is obtained by a solution mixture of a hydrogen peroxide solution (0.2 wt %), and CMS8421 containing an alkaline component that chemically forms a film to be polished on the surface of a Cu film and CMS8472 (available from JSR) containing silica that mechanically removes the film to be polished. The touchup amount is 20 nm.

In each of the above-described polishing experiments, the Cu dishing 31, corrosion 32, dust 33, scratch 34, and Cu residue were evaluated.

FIG. 4 shows the results of polishing experiments conducted under the different CMP conditions of this embodiment, and the results of a polishing experiment conducted under (normal) CMP conditions (polishing load: 180 gf/cm$^2$, and flow rate: 300 cc/min) of a comparative example. The polishing experiments conducted under the different CMP conditions are Experiments 1 to 10, and the polishing experiment conducted under the normal CMP conditions is Experiment 11.

Experiments 2, 4, 6, 8, and 10 were polishing experiments conducted at a flow rate of 150 cc/min and a polishing load of 320 gf/cm$^2$, in which the exit temperature was adjusted to be higher by 5° C. or more than the entrance temperature (in Experiment 2, the exit temperature was higher by 4° C. than the entrance temperature).

Experiments 3, 5, 7, and 9 were polishing experiments conducted at a flow rate of 150 cc/min, in which the exit temperature was adjusted to be higher by less than 5° C. than the entrance temperature. The exit temperature was adjusted by controlling the polishing load. More specifically, the exit temperature can be adjusted to be higher by less than 5° C. than the entrance temperature by making the polishing load lower than, e.g., 320 gf/cm$^2$.

Experiment 11 was a polishing experiment (reference) conducted at a flow rate of 300 cc/min and a polishing load of 180 gf/cm$^2$, i.e., under normal conditions. Although FIG. 4 shows that the entrance temperature was 40° C. in Experiment 11, the entrance temperature was not held constant because no control was performed by the cooling nozzles 28 in Experiment 11.

Experiment 1 was a polishing experiment conducted by raising the temperature of the polishing pad 21 to 60° C. in advance by bringing a heat exchanger into contact with the surface of the polishing pad 21 in Experiment 11.

In each of Experiments 1 to 10, the entrance temperature was adjusted and held constant by changing the flow rate of compressed air from the cooling nozzles 28 within the range of 0 to 1,000 l/min.

The Cu dishing 31, corrosion 32, dust 33, scratch 34, and Cu residue were evaluated by the following criteria. ○ indicates an allowable range for each of these items.

Cu dishing . . . ○: 30 nm or less, x: larger than 30 nm
Corrosion . . . ○: 100 or less, x: more than 100
Dust . . . ○: 100 or less, x: more than 100
Scratch . . . ○: 100 or less, x: more than 100
Cu residue . . . ○: removable by touchup amount of 20 nm, x: not removable by touchup amount of 20 nm As shown in FIG. 4, under the normal CMP conditions of Experiment 11, the Cu dishing and corrosion fell within the allowable ranges, but the dust, scratch, and Cu residue fell outside the allowable ranges.

When the entrance temperature was 40° C. to 60° C. under the CMP conditions in which the flow rate was 150 cc/min (Experiments 1 to 6), the evaluations were inferior to those obtained under the normal CMP conditions of Experiment 11. The evaluations were similarly inferior when the entrance temperature was 30° C. or less and the exit temperature was higher by less than 5° C. than the entrance temperature (Experiments 7 and 9). That is, under the CMP conditions of Experiments 1 to 6, 7, and 9, all of the Cu dishing 31, corrosion 32, dust 33, scratch 34, and Cu residue fell outside the allowable ranges.

On the other hand, when the entrance temperature was 30° C. or less and the exit temperature was higher by 5° C. or more than the entrance temperature under the CMP conditions in which the flow rate was 150 cc/min (Experiments 8 and 10), the evaluations were superior to those obtained under the normal CMP conditions of Experiment 11. More specifically, all of the Cu dishing 31, corrosion 32, dust 33, scratch 34, and Cu residue fell within the allowable ranges.

The reason is presumably as follows.

The hardness of the polishing pad at 30° C. is higher by about 50% or more than that at 40° C. to 50° C. This reduces the Cu dishing 31 and dust 33.

On the other hand, the activity of a chemical reaction generally decreases as the temperature decreases. For example, the lower the temperature, the slower the oxidation of Cu (a reaction in which $Cu^{2+}$ and a protective film formation agent react with each other to form a CMP protective film) and the oxidation of a slurry component (a reaction in which the organic component (protective film formation agent) that forms the protective film together with $Cu^{2+}$ oxidizes, and a monomer changes into a polymer) caused by ammonium persulfate. That is, when $Cu^{2+}$ and the protective film formation agent react with each other, a dense protective film mainly containing a monomer is formed. Accordingly, a well-finished (dense) CMP protective film is formed on the Cu surface, and this probably makes the Cu residue, Cu corrosion 32, and Cu scratch 34 hard to occur.

[Effects]

In the above-mentioned first embodiment, when performing CMP after the Cu film 16 is deposited as an interconnection, the use amount of the slurry 24 can be reduced by setting the flow rate of the slurry 24 at 150 cc/min lower than the normal flow rate. This makes it possible to reduce the cost of the CMP process.

Also, in the CMP process, the entrance temperature of the polishing pad 21 is adjusted to 30° C. or less by controlling the cooling nozzles 28, and the exit temperature is adjusted to be higher by 5° C. or more than the entrance temperature by controlling the polishing load. Accordingly, the CMP characteristics can be improved even when the flow rate of the slurry 24 is set at 150 cc/min lower than the normal flow rate.

That is, as indicated by the polishing experiments, this embodiment can simultaneously achieve the cost reduction of the CMP process and the improvement of the CMP characteristics, which previously had a tradeoff relationship.

<Second Embodiment>

A semiconductor device manufacturing method according to the second embodiment will be explained below with reference to FIG. 5. In the second embodiment, an explanation of the same features as those of the above-mentioned first embodiment will be omitted, and only differences will be explained.

[CMP Conditions]

The CMP conditions of this embodiment are applicable to, e.g., a case in which, when forming an interconnection structure, a barrier metal is deposited by about 20 nm, and a Cu film 16 as an interconnection is deposited by about 2 μm. More specifically, the CMP conditions are applied when forming a damascene interconnection of logic or the like, or when forming a contact or via.

In CMP according to this embodiment, while a turntable 20 on which a polishing pad 21 is adhered is rotated at 100 rpm, a top ring 23 holding a semiconductor substrate 10 having a diameter of 300 mm is pressed against the polishing pad 21 with a polishing load of 320 gf/cm². In this step, the top ring 23 is rotated at 102 rpm. In addition, a slurry supply nozzle 25 supplies a slurry 24 onto the polishing pad 21 at a flow rate of 150 cc/min.

In this embodiment, CMP is performed by adjusting the entrance temperature and exit temperature of the polishing pad 21 measured by an entrance temperature measurement device 26 and exit temperature measurement device 27. More specifically, the adjustment is performed such that the entrance temperature is equal to or higher than 40° C. and be equal to or lower than 50° C., and the exit temperature is higher by 5° C. or more than the entrance temperature. The entrance temperature is adjusted by controlling cooling nozzles 28. That is, the temperature of the polishing pad 21 tends to rise during CMP due to friction or the like, but the entrance temperature can be held constant by cooling the polishing pad 21 by using the cooling nozzles 28. Also, the exit temperature is adjusted by controlling the polishing load and flow rate. For example, the exit temperature rises when the polishing load is increased.

That is, in this embodiment, the entrance temperature is adjusted to 40° C. (inclusive) to 50° C. (inclusive) by controlling the cooling nozzles 28, and the exit temperature is adjusted to be higher by 5° C. or more than the entrance temperature by controlling the polishing load to 320 gf/cm² and the flow rate to 150 cc/min. Note that from the viewpoint of productivity, the polishing load is desirably as high as possible, and the exit temperature is desirably adjusted to be higher by 7.5° C. or more than the entrance temperature.

[Polishing Experiments]

Polishing experiments as the bases of the CMP conditions of this embodiment will be described below.

With the Cu film 16 being formed by about 2 μm, polishing experiments were conducted by setting the flow rate of the slurry 24 at 150 cc/min, and changing the entrance and exit temperatures. More specifically, the polishing experiments were conducted by adjusting the entrance temperature to 21° C., 30° C., 40° C., 50° C., and 60° C., and adjusting the exit temperature to be higher by 5° C. or more or by less than 5° C. than the entrance temperature.

The Cu removal time (productivity) was evaluated in each of the above-described experiments.

FIG. 5 shows the results of polishing experiments conducted under the different CMP conditions, and the results of a polishing experiment conducted under (normal) CMP conditions (polishing load: 180 gf/cm², and flow rate: 300 cc/min) of a comparative example. The polishing experiments conducted under the different CMP conditions are Experiments 12 to 21, and the polishing experiment conducted under the normal CMP conditions is Experiment 22.

Experiments 13, 15, 17, 19, and 21 were polishing experiments conducted at a flow rate of 150 cc/min and a polishing load of 320 gf/cm$^2$, in which the exit temperature was adjusted to be higher by 5° C. or more than the entrance temperature.

Experiments 12, 14, 16, 18, and 20 were polishing experiments conducted at a flow rate of 150 cc/min, in which the exit temperature was adjusted to be higher by less than 5° C. than the entrance temperature. The exit temperature was adjusted by controlling the polishing load. More specifically, the exit temperature can be adjusted to be higher by less than 5° C. than the entrance temperature by making the polishing load lower than, e.g., 320 gf/cm$^2$.

Experiment 22 was a polishing experiment (reference) conducted at a flow rate of 300 cc/min and a polishing load of 180 gf/cm$^2$, i.e., under the normal conditions. Although FIG. 5 shows that the entrance temperature was 51° C. in Experiment 22, the entrance temperature was not held constant because no control was performed by the cooling nozzles 28 in Experiment 22.

In each of Experiments 12 to 21, the entrance temperature was adjusted and held constant by changing the flow rate of compressed air from the cooling nozzles 28 within the range of 0 to 1,000 l/min.

The Cu film removal time was evaluated by the following criterion. ○ indicates an allowable range.

Cu film removal time . . . ○: 120 sec or less, x: more than 120 sec

As shown in FIG. 5, under the normal CMP conditions of Experiment 22, the Cu film removal time fell outside the allowable range.

When the entrance temperature was 60° C. or 30° C. or less under the CMP conditions in which the flow rate was 150 cc/min (Experiments 12, 13, and 18 to 21), the Cu film removal time fell outside the allowable range as in the normal CMP conditions of Experiment 22. Also, when the entrance temperature was 40° C. to 50° C. and the exit temperature was higher by less than 5° C. than the entrance temperature (Experiments 14 and 16), the Cu film removal time fell outside the allowable range.

On the other hand, when the entrance temperature was 40° C. to 50° C. and the exit temperature was higher by 5° C. or more than the entrance temperature under the CMP conditions in which the flow rate was 150 cc/min (Experiments 15 and 17), the Cu film removal time fell within the allowable range.

This is probably due to the mechanical polishing force and chemical polishing force at 40° C. to 50° C.

More specifically, silica contained in the slurry 24 used in this embodiment aggregates when the temperature rises, and the average grain size significantly increases especially when the temperature exceeds 40° C. This increases the mechanical polishing force in CMP.

Also, the decomposition of ammonium persulfate contained in the slurry 24 is accelerated at 40° C. to 50° C. That is, the generation of SO$_4$ radicals having an oxidizing power is promoted. This increases the oxidizing power (oxidation cycle speed) of the film (Cu film) to be processed. Accordingly, the components of the slurry oxidize, and a monomer changes into a polymer. Consequently, silica contained in the slurry 24 easily polishes the Cu film surface, thereby increasing the chemical polishing force.

[Effects]

In the CMP process of the above-mentioned second embodiment, the entrance temperature of the polishing pad 21 is adjusted to 40° C. (inclusive) to 50° C. (inclusive) by controlling the cooling nozzles 28, and the exit temperature is adjusted to be higher by 5° C. or more than the entrance temperature by controlling the polishing load. Accordingly, even when the flow rate of the slurry 24 is set at 150 cc/min lower than the normal flow rate, it is possible to increase the polishing rate of CMP, thereby shortening the polishing time.

In addition, since the use amount of the slurry can further be reduced by shortening the polishing time, it is possible to further reduce the cost of the CMP process.

<Third Embodiment>

A semiconductor device manufacturing method according to the third embodiment will be explained below with reference to FIG. 6. In the third embodiment, an explanation of the same features as those of the above-mentioned embodiments will be omitted, and only differences will be explained.

[CMP Conditions]

The CMP conditions of this embodiment are applicable to, e.g., a case in which, when forming an interconnection structure, a barrier metal is deposited by about 5 nm and a Cu film 16 as an interconnection is deposited by about 400 nm, or the barrier metal is deposited by about 20 nm and the Cu film 16 as an interconnection is deposited by about 2 μm.

In CMP according to this embodiment, while a turntable 20 on which a polishing pad 21 is adhered is rotated at 60 rpm, a top ring 23 holding a semiconductor substrate 10 having a diameter of 300 mm is pressed against the polishing pad 21 with a polishing load of 320 gf/cm$^2$. In this step, the top ring 23 is rotated at 40 rpm. In addition, a slurry supply nozzle 25 supplies a slurry 24 onto the polishing pad 21 at a flow rate of 150 cc/min.

In this embodiment, CMP is performed by adjusting the entrance temperature and exit temperature of the polishing pad 21 measured by an entrance temperature measurement device 26 and exit temperature measurement device 27.

More specifically, the adjustment is first performed such that the entrance temperature is equal to or higher than 40° C. and equal to or lower than 50° C. and the exit temperature is higher by 5° C. or more than the entrance temperature (a first polishing step). These CMP conditions are the same as those of the second embodiment, and excellent in polishing rate (productivity). Note that from the viewpoint of productivity, the polishing load is desirably as high as possible, and the exit temperature is desirably adjusted to be higher by 7.5° C. or more than the entrance temperature.

Then, the adjustment is performed such that the entrance temperature is equal to or lower than 30° C. and the exit temperature is higher by 5° C. or more than the entrance temperature (a second polishing step). These CMP conditions are the same as those of the first embodiment, and excellent in CMP characteristics (processability). Note that from the viewpoint of productivity, the polishing load is desirably as high as possible, and the exit temperature is desirably adjusted to be higher by 10° C. or more than the entrance temperature.

That is, the first polishing step in which the entrance temperature is 40° C. (inclusive) to 50° C. (inclusive) is continuously switched, midway during CMP, to the second polishing step in which the entrance temperature is 30° C. or less. This switching is done by controlling cooling nozzles 28. Also, the switching is performed when the residue of the deposited Cu film 16 (the residual Cu film) is 50 nm or more. This residual Cu film is measured by monitoring an electrical signal when the semiconductor substrate 10 passes over an eddy-current coil sensor (not shown) embedded in the turntable 20. This measurement is a general method performable in-situ.

That is, in this embodiment, the first polishing step superior in productivity is performed when the amount of residual Cu film is large, and the second polishing step superior in processability is performed when the amount of residual Cu film is small.

Note that the switching is desirably performed when the residual Cu film is 100 nm or more as long as the productivity is allowable.

[Polishing Experiments]

Polishing experiments as the bases of the CMP conditions of this embodiment will be described below.

With the Cu film 16 being formed by about 400 nm, polishing experiments were conducted by setting the flow rate of the slurry 24 at 150 cc/min, and changing the timing of switching from the first polishing step to the second polishing step. More specifically, the polishing experiments were conducted by switching the first polishing step to the second polishing step when the residual Cu film was 70, 50, and 30 nm.

In each of the above-described polishing experiments, Cu dishing 31, corrosion 32, dust 33, scratch 34, the Cu residue, and the Cu removal time (productivity) were evaluated.

FIG. 6 shows the results of polishing experiments conducted under the different CMP conditions, and the results of a polishing experiment conducted under the CMP conditions of the second polishing step (the CMP conditions of the first embodiment). The polishing experiments conducted under the different CMP conditions are Experiments 23 to 25, and the polishing experiment conducted under the CMP conditions of the second polishing step is Experiment 8.

Experiment 23 was a polishing experiment in which the first polishing step was switched to the second polishing step when the residual Cu film was 70 nm. Experiment 24 was a polishing experiment in which the first polishing step was switched to the second polishing step when the residual Cu film was 50 nm. Experiment 25 was a polishing experiment in which the first polishing step was switched to the second polishing step when the residual Cu film was 30 nm.

The Cu dishing 31, corrosion 32, dust 33, scratch 34, and Cu residue were evaluated by the same criteria as those of the first embodiment, and the Cu film removal time was evaluated by the following criterion. ○ indicates an allowable range.

Cu film removal time . . . ○: 60 sec or less, x: more than 60 sec

As shown in FIG. 6, under the CMP conditions of the first embodiment in Experiment 8, the Cu film removal time fell outside the allowable range. That is, the CMP conditions of Experiment 8 were superior in processability, but had the problem that the Cu film removal time was as long as 75 sec. It is desirable to shorten the Cu film removal time to 60 sec or less from the viewpoint of productivity.

When the first polishing step was switched to the second polishing step when the residual Cu film was 30 nm (Experiment 25), the productivity was higher than that obtained by the CMP conditions of Experiment 8, but the processability deteriorated. This is so because even when the second polishing step superior in processability was performed after the residual Cu film became 30 nm, it was impossible to completely process the deteriorating element produced in the first polishing step. More specifically, if a Cu dishing 31 or scratch 34 having a depth of 30 nm or more occurs in the first polishing step, the Cu dishing 31 or scratch 34 remains even when the second polishing step is performed after that.

On the other hand, it was possible to avoid the above-mentioned problem by switching the first polishing step to the second polishing step when the residual Cu film was 50 nm or more (Experiments 23 and 24). Accordingly, the processability was as high as that obtained by the CMP conditions of Experiment 8, and the productivity was higher than that obtained by the CMP conditions of Experiment 8.

[Effects]

In the CMP process of the above-mentioned third embodiment, after the first polishing step in which the entrance temperature of the polishing pad 21 is 40° C. (inclusive) to 50° C. (inclusive) and the exit temperature is higher by 5° C. or more than the entrance temperature is performed, the second polishing step in which the entrance temperature is 30° C. or less and the exit temperature is higher by 5° C. or more than the entrance temperature is performed. Since the first polishing step is initially performed and then the second polishing step for finishing is performed as described above, it is possible to shorten the polishing time and improve the CMP characteristics at the same time. That is, the productivity and processability can be increased.

Also, when switching the first polishing step to the second polishing step, it is desirable to change the entrance temperature to 30° C. or less as fast as possible. For example, it is effective to perform a step of decreasing the frictional heat by supplying inexpensive pure water at a flow rate of 1,000 cc/min for 5 sec, or instantaneously freeing the polishing load (to 0 hPa), when the residual Cu film is 50 nm or more and has no influence on finishing. Note that the pure water is preferably at room temperature (e.g., 25° C.) or less, for example, at about 18° C. to 21° C.

Note that even when performing the second polishing step adjusted such that the entrance temperature is 30° C. or less and the exit temperature is higher by 5° C. or more than the entrance temperature as in the CMP conditions of the first embodiment, in touchup during which finishing is most important, it is possible to improve the Cu dishing 31, corrosion 32, dust 33, and scratch 34, and increase the polishing rate.

<Fourth Embodiment>

A semiconductor device manufacturing method according to the fourth embodiment will be explained below with reference to FIG. 7. In the fourth embodiment, an explanation of the same features as those of the above-mentioned embodiments will be omitted, and only differences will be explained.

[CMP Conditions]

The CMP conditions of this embodiment are applicable to, e.g., a case in which, when forming an interconnection structure, a barrier metal (e.g., TiN) is deposited by about 5 nm and a W film 16', instead of a Cu film 16, as an interconnection is deposited by about 400 nm, or the barrier metal is deposited by about 20 nm and the W film 16' as an interconnection is deposited by about 2 μm.

In CMP according to this embodiment, while a turntable 20 on which a polishing pad 21 is adhered is rotated at 80 rpm, a top ring 23 holding a semiconductor substrate 10 having a diameter of 300 mm is pressed against the polishing pad 21 with a polishing load of 250 gf/cm$^2$. In this step, the top ring 23 is rotated at 82 rpm. In addition, a slurry supply nozzle 25 supplies a slurry 24 onto the polishing pad 21 at a flow rate of 100 cc/min.

A slurry stock solution is obtained by using hydrogen peroxide (2 wt %), and W7573B (available from Cabot) that is acidic, chemically forms a film to be polished on the surface of a W film, and contains silica for mechanically removing the film to be polished.

In this embodiment, CMP is performed by adjusting the entrance temperature and exit temperature of the polishing pad 21 measured by an entrance temperature measurement device 26 and exit temperature measurement device 27.

More specifically, the adjustment is first performed such that the entrance temperature is 40° C. (inclusive) to 50° C. (inclusive) and the exit temperature is higher by 5° C. or more than the entrance temperature (a first polishing step). These CMP conditions are the same as those of the second embodiment using the Cu film 16 as an interconnection, and superior in polishing rate (productivity) although the W film 16' is used.

Then, the adjustment is performed such that the entrance temperature is 30° C. or less and the exit temperature is higher by 5° C. or more than the entrance temperature (a second polishing step). These CMP conditions are the same as those of the first embodiment using the Cu film 16 as an interconnection, and superior in CMP characteristics (processability) although the W film 16' is used.

That is, the first polishing step in which the entrance temperature is 40° C. (inclusive) to 50° C. (inclusive) is continuously switched, midway during CMP, to the second polishing step in which the entrance temperature is 30° C. or less. This switching is done by controlling cooling nozzles 28. Also, the switching is performed when the residue of the deposited W film 16' (the residual W film) is 50 nm or more.

That is, in this embodiment, the first polishing step superior in productivity is performed when the amount of residual W film is large, and the second polishing step superior in processability is performed when the amount of residual W film is small.

Note that the switching is desirably performed when the residual W film is 100 nm or more as long as the productivity is allowable.

[Polishing Experiments]

Polishing experiments as the bases of the CMP conditions of this embodiment will be described below.

With the W film 16' being formed by about 400 nm, polishing experiments were conducted by setting the flow rate of the slurry 24 at 100 cc/min, and changing the timing of switching from the first polishing step to the second polishing step. More specifically, the polishing experiments were conducted by switching the first polishing step to the second polishing step when the residual W film was 70, 50, and 30 nm.

In each of the above-described polishing experiments, W dishing 31', corrosion 32', dust 33', scratch 34', the W residue, and the W removal time (productivity) were evaluated.

FIG. 7 shows the results of polishing experiments conducted under the different CMP conditions, and the results of a polishing experiment conducted under the CMP conditions of the second polishing step (the CMP conditions of the first embodiment). The polishing experiments conducted under the different CMP conditions are Experiments 23' to 25', and the polishing experiment conducted under the CMP conditions of the second polishing step is Experiment 8'.

Experiment 23' was a polishing experiment in which the first polishing step was switched to the second polishing step when the residual W film was 70 nm. Experiment 24' was a polishing experiment in which the first polishing step was switched to the second polishing step when the residual W film was 50 nm. Experiment 25' was a polishing experiment in which the first polishing step was switched to the second polishing step when the residual W film was 30 nm.

Experiment 8' was a polishing experiment in which the W film 16' was applied as an interconnection in the first embodiment.

The W dishing 31', corrosion 32', dust 33', scratch 34', W residue, and W film removal time were evaluated by the same criteria as those of the third embodiment.

As shown in FIG. 7, under the CMP conditions of the first embodiment in Experiment 8', the W film removal time fell outside the allowable range.

When the first polishing step was switched to the second polishing step when the residual W film was 30 nm (Experiment 25'), the productivity was higher than that obtained by the CMP conditions of Experiment 8', but the processability deteriorated. This is so because even when the second polishing step superior in processability was performed after the residual W film became 30 nm, it was impossible to completely process the deteriorating element produced in the first polishing step. More specifically, if a W dishing 31' or scratch 34' having a depth of 30 nm or more occurs in the first polishing step, the W dishing 31' or scratch 34' remains even when the second polishing step is performed after that.

On the other hand, it was possible to avoid the above-mentioned problem when switching the first polishing step to the second polishing step when the residual W film was 50 nm or more (Experiments 23' and 24'). Accordingly, the processability was as high as that obtained by the CMP conditions of Experiment 8', and the productivity was higher than that obtained by the CMP conditions of Experiment 8'.

[Effects]

In the above-mentioned fourth embodiment, when performing CMP after the W film 16' as an interconnection is deposited, the use amount of the slurry 24 can be reduced by setting the flow rate of the slurry 24 at 100 cc/min lower than the normal flow rate. This makes it possible to reduce the cost of the CMP process.

Also, in the CMP process for the W film 16', after the first polishing step in which the entrance temperature of the polishing pad 21 is 40° C. (inclusive) to 50° C. (inclusive) and the exit temperature is higher by 5° C. or more than the entrance temperature is performed, the second polishing step in which the entrance temperature is 30° C. or less and the exit temperature is higher by 5° C. or more than the entrance temperature is performed. Since the first polishing step is initially performed and then the second polishing step for finishing is performed as described above, it is possible to shorten the polishing time and improve the CMP characteristics at the same time. That is, the productivity and processability can be increased.

Furthermore, since the use amount of the slurry can further be reduced by shortening the polishing time, it is possible to further reduce the cost of the CMP process for the W film 16'.

<Fifth Embodiment>

A semiconductor device manufacturing method according to the fifth embodiment will be explained below with reference to FIGS. 8A, 8B, and 9. In the fifth embodiment, an explanation of the same features as those of the above-mentioned embodiments will be omitted, and only differences will be explained.

[STI (Shallow Trench Isolation) Manufacturing Method]

FIGS. 8A and 8B illustrate semiconductor device interconnection structure manufacturing steps according to this embodiment.

First, as shown in FIG. 8A, a silicon nitride film 90 as a stopper film is formed on a semiconductor substrate 10. The film thickness of the silicon nitride film 90 is, e.g., 70 nm. After that, STI patterns B are formed in the semiconductor substrate 10 by using a silicon oxide film or the like as an etching mask. The depth of the STI patterns B is, e.g., 250 nm.

Note that a silicon oxide film or the like may be formed between the semiconductor substrate 10 and silicon nitride film 90.

Then, a silicon oxide film 91 is formed on the entire surface by, e.g., high-density plasma CVD (HDP-CVD). In this step, the silicon oxide film 91 is also formed outside the STI patterns B, and has a film thickness of 400 nm. The STI has patterns of line/space: 1/1 μm.

Subsequently, as shown in FIG. 8B, the extra silicon oxide film 91 formed outside the STI patterns B is removed by performing CMP on the entire surface. Consequently, the silicon oxide film 91 is buried in the STI patterns B. Also, the surface of the silicon nitride film 90 is exposed outside the STI patterns B. Details of CMP will be described later.

[CMP Conditions]

The CMP conditions of this embodiment are applicable to, e.g., a case in which, when forming STI, a silicon oxide film (oxide) is deposited by about 400 nm.

In CMP according to this embodiment, while a turntable 20 on which a polishing pad 21 is adhered is rotated at 110 rpm, a top ring 23 holding a semiconductor substrate 10 having a diameter of 300 mm is pressed against the polishing pad 21 with a polishing load of 300 gf/cm². In this step, the top ring 23 is rotated at 120 rpm. In addition, a slurry supply nozzle 25 supplies a slurry 24 onto the polishing pad 21 at a flow rate of 100 cc/min.

The slurry 24 contains cerium oxide (DLS2 available from Hitachi Chemical) as abrasive grains, and ammonium polycarboxylate (TK75 available from Kao).

In this embodiment, CMP is performed by adjusting the entrance temperature and exit temperature of the polishing pad 21 measured by an entrance temperature measurement device 26 and exit temperature measurement device 27.

More specifically, the adjustment is first performed such that the entrance temperature is 40° C. (inclusive) to 50° C. (inclusive) and the exit temperature is higher by 5° C. or more than the entrance temperature (a first polishing step). These CMP conditions are the same as those of the second embodiment using the Cu film 16 as an interconnection, and excellent in polishing rate (productivity) although the silicon oxide film 91 is used as STI.

Then, the adjustment is performed such that the entrance temperature is 30° C. or less and the exit temperature is higher by 5° C. or more than the entrance temperature (a second polishing step). These CMP conditions are the same as those of the first embodiment using the Cu film 16 as an interconnection, and superior in CMP characteristics (processability) although the silicon oxide film 91 is used as STI.

That is, the first polishing step in which the entrance temperature is 40° C. (inclusive) to 50° C. (inclusive) is continuously switched, midway during CMP, to the second polishing step in which the entrance temperature is 30° C. or less. This switching is done by controlling cooling nozzles 28. Also, the switching is performed when the residue of the deposited silicon oxide film 91 (the residual oxide film) is 70 nm or more.

[Polishing Experiments]

Polishing experiments as the bases of the CMP conditions of this embodiment will be described below.

With the silicon oxide film 91 being formed by about 400 nm, polishing experiments were conducted by setting the flow rate of the slurry 24 at 100 cc/min, and switching the first polishing step to the second polishing step when the residual oxide film was 70 nm.

In each of the above-described polishing experiments, oxide dishing, dust, scratch, and the oxide removal time (productivity) were evaluated.

FIG. 9 shows the results of a polishing experiment conducted under the CMP conditions of this embodiment, and the results of a polishing experiment conducted under the CMP conditions of the second polishing step (the CMP conditions of the first embodiment). The polishing experiment conducted under the CMP conditions of this embodiment is Experiment 27, and the polishing experiment conducted under the CMP conditions of the second polishing step is Experiment 26.

Experiment 27 was a polishing experiment in which the first polishing step was switched to the second polishing step when the residual oxide film was 70 nm.

Experiment 26 was a polishing experiment in which the silicon oxide film 91 was applied to the first embodiment.

The oxide dishing, dust, scratch, and oxide film removal time were evaluated by the same criteria as those of the fourth embodiment.

As shown in FIG. 9, under the CMP conditions of the first embodiment in Experiment 26, the oxide dishing and oxide film removal time fell outside the allowable ranges.

On the other hand, when switching the first polishing step to the second polishing step when the residual oxide film was 70 nm (Experiment 27), the processability and productivity were superior to those obtained by the CMP conditions of Experiment 26.

[Effects]

In the above-mentioned fifth embodiment, when performing CMP after the silicon oxide film 91 as STI is deposited, the use amount of the slurry 24 can be reduced by setting the flow rate of the slurry 24 at 100 cc/min lower than the normal flow rate. This makes it possible to reduce the cost of the CMP process.

Also, in the CMP process for the silicon oxide film 91, after the first polishing step in which the entrance temperature of the polishing pad 21 is 40° C. (inclusive) to 50° C. (inclusive) and the exit temperature is higher by 5° C. or more than the entrance temperature is performed, the second polishing step in which the entrance temperature is 30° C. or less and the exit temperature is higher by 5° C. or more than the entrance temperature is performed. Since the first polishing step is initially performed and then the second polishing step for finishing is performed as described above, it is possible to shorten the polishing time and improve the CMP characteristics at the same time. That is, the productivity and processability can be increased.

In addition, since the use amount of the slurry can further be reduced by shortening the polishing time, it is possible to further reduce the cost of the CMP process for the silicon oxide film 91.

<Sixth Embodiment>

A semiconductor device manufacturing method according to the sixth embodiment will be explained with reference to FIGS. 10, 11, 12, 13, 14, 15A, 15B, 16A, and 16B. The sixth embodiment is an application example of the above-described embodiments, in which film thickness uniformity is attained by feedback control of the polishing load in each region. This allows to shorting the CMP time and improving the CMP characteristics. In the sixth embodiment, an explanation of the same features as those of the above-mentioned embodiments will be omitted, and only differences will be explained.

[CMP Apparatus]

Figure 10:
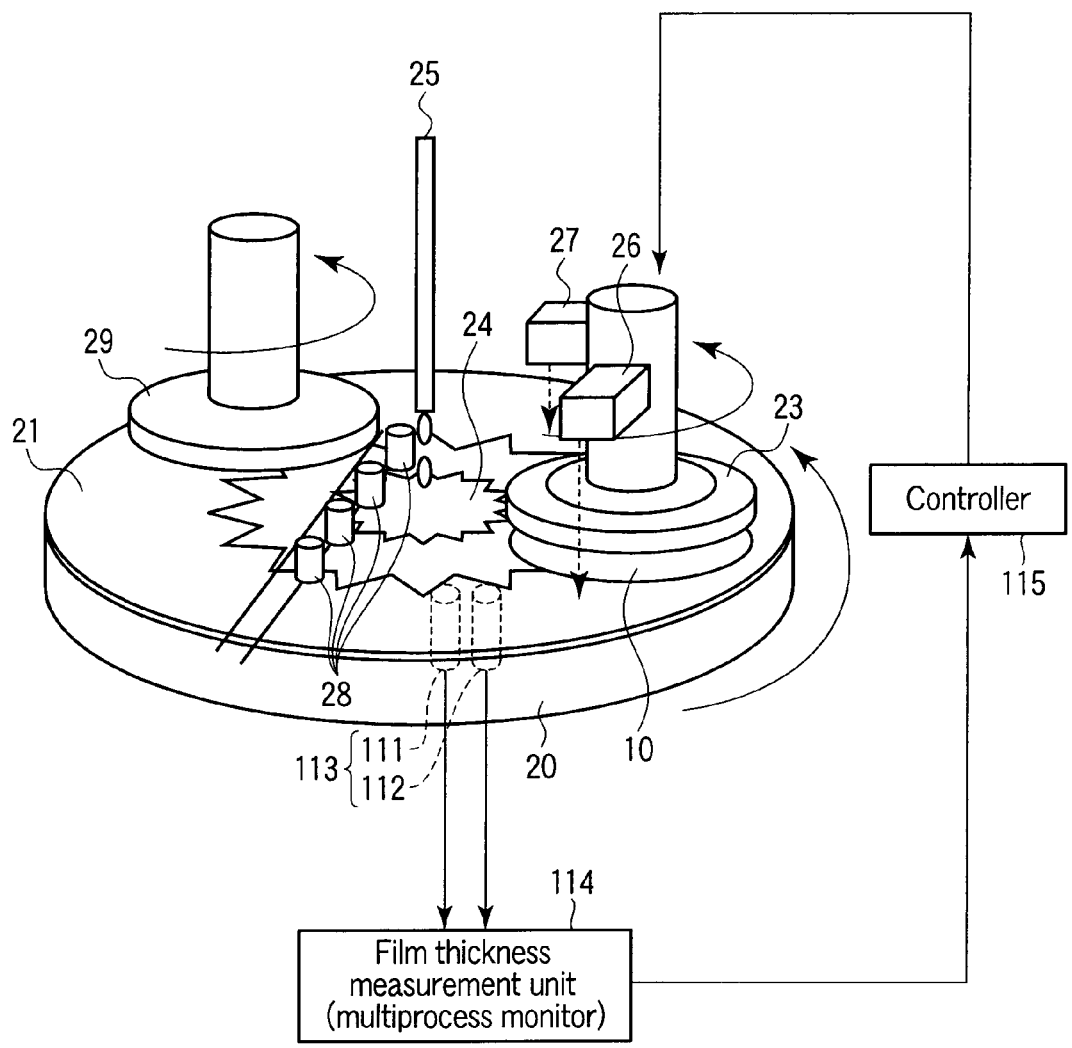
FIG. 10 is a view showing the arrangement of a CMP apparatus according to the sixth embodiment.

FIG. 10 is a view showing the arrangement of a CMP apparatus according to this embodiment. FIG. 11 is a plan view of the CMP apparatus according to this embodiment.

As shown in FIG. 10, this embodiment is different from the above-described embodiments in that the CMP apparatus comprises an eddy-current sensor coil 113, a film thickness measurement unit (multiprocess monitor) 114, and a controller 115, and controls a top ring 23 using these components in the CMP process so as to change the polishing load on a semiconductor substrate 10 (film to be processed) between the regions. The components of this embodiment will be described below.

The eddy-current sensor coil 113 is embedded in a turntable 20, and includes a coil 111 configured to form an eddy current in the conductive film (Cu film or W film) to be processed, and a coil 112 configured to detect the eddy current in the film to be processed. That is, when the semiconductor substrate 10 on which the film to be processed is formed passes above the eddy-current sensor coil 113, the coil 111 applies an electric field to the film to be processed to generate an eddy current, and the coil 112 detects the eddy current generated in the film to be processed. As shown in FIG. 11, the eddy-current sensor coil 113 is embedded in the turntable 20 on a circular orbit X passing through a center O' of the top ring 23, and having a predetermined distance from a center O of the turntable 20.

The film thickness measurement unit 114 measures and monitors the film thickness of the film to be processed in each region based on the eddy current of the film to be processed the eddy-current sensor coil 113 has generated and detected. More specifically, the eddy current and the film thickness of the film to be processed have a proportional relationship. Hence, the film thickness is measured so that the larger the eddy current is, the larger the film thickness is, or the smaller the eddy current is, the smaller the film thickness is.

The controller 115 controls the polishing load on the semiconductor substrate 10 (film to be processed) attached to the top ring 23 for each region based on the region-specific film thickness of the film to be processed measured by the film thickness measurement unit 114.

The top ring 23 according to this embodiment will be explained below.

In FIG. 12, (a) indicates a sectional view of the top ring 23 according to this embodiment, and (b) indicates a plan view of the top ring 23 according to this embodiment.

As shown in (b) of FIG. 12, the top ring 23 holding the semiconductor substrate 10 is connected to a top ring driving shaft 121, and includes a guide ring 122, a chucking plate 123, a center bag 124, a middle tube 125, an edge tube 126, and fluid channels 127, 128, and 129.

The guide ring 122 having a ring shape is arranged at the perimeter and holds the whole top ring 23 and the semiconductor substrate 10 inside. The guide ring 122 is made of a strong rigid material such as a metal or a ceramic.

The chucking plate 123 is arranged in the guide ring 122. The chucking plate 123 has a disc shape, like the semiconductor substrate 10, and supports the center bag 124, the middle tube 125, and the edge tube 126. The chucking plate 123 is preferably made of a nonmagnetic material, for example, a fluorocarbon resin such as tetrafluoroethylene resin or an insulating material such as SiC (silicon carbide) or $Al_2O_3$ (alumina). However, the present invention is not limited to this. The chucking plate 123 may be made of a metal material when measuring the film thickness without using an eddy current.

The center bag 124, the middle tube 125, and the edge tube 126 are arranged under the chucking plate 123 and supported by it. More specifically, as shown in (b) of FIG. 12, the center bag 124 is arranged at the center (center region) of the chucking plate 123. The middle tube 125 is formed into a ring shape and arranged at the perimeter of the center bag 124 (middle region). The edge tube 126 is formed into a ring shape and arranged at the perimeter of the middle tube 125 (edge region). The lower surface side (the side of the surface without the film to be processed) of the semiconductor substrate 10 is pressed against the lower side of the center bag 124, the middle tube 125, and the edge tube 126.

The center bag 124, the middle tube 125, and the edge tube 126 are made of a strong durable rubber material such as ethylene propylene rubber (EPDM), polyurethane rubber, or silicone rubber.

The center bag 124, the middle tube 125, and the edge tube 126 have spaces serving as pressure chambers 124', 125', and 126' inside. The fluid channels 127, 128, and 129 communicate with the pressure chambers 124', 125', and 126', respectively. A pressurized fluid such as pressurized air, or the atmospheric pressure or vacuum is supplied to the pressure chambers 124', 125', and 126' through the fluid channels 127, 128, and 129, respectively.

That is, a pressurized fluid such as pressurized air, or the atmospheric pressure or vacuum is supplied to the center bag 124, the middle tube 125, and the edge tube 126 made of an elastic material to control the pressures in the pressure chambers 124', 125', and 126', thereby adjusting the polishing load in the CMP process. In this embodiment, the controller 115 can independently adjust the pressures in the pressure chambers 124', 125', and 126'. That is, it is possible to adjust the polishing load in the CMP process for each of the center region, the middle region, and the edge region of the semiconductor substrate 10.

[CMP Method]

A CMP method according to this embodiment will be explained below.

Figure 13:
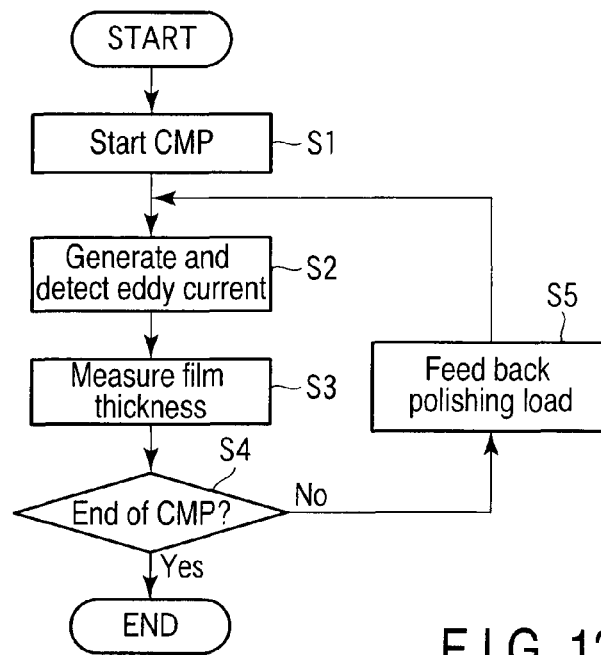
FIG. 13 is a flowchart showing a CMP method according to the sixth embodiment.
Figure 14:
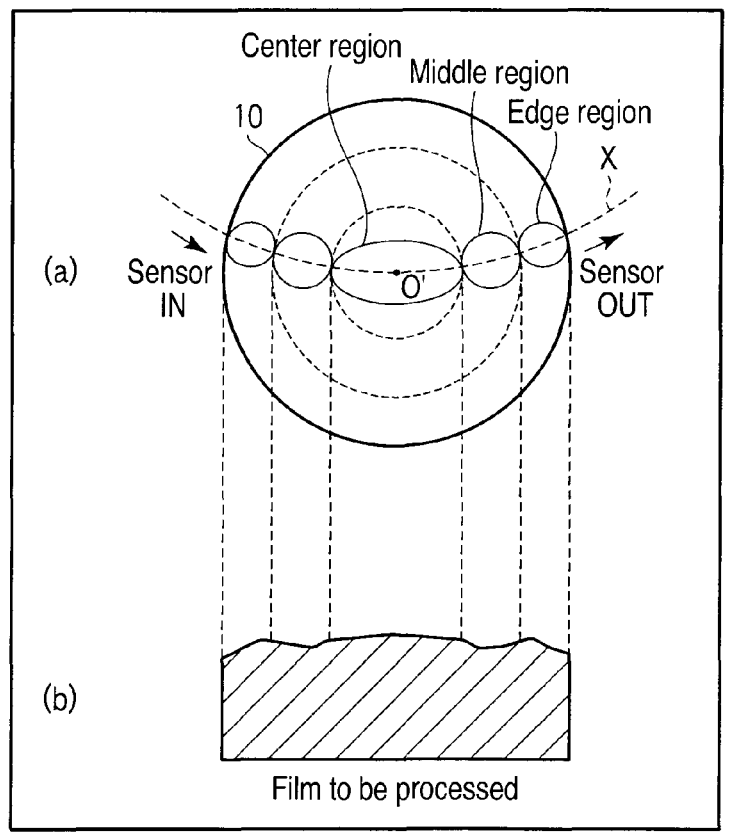
FIG. 14 is a view showing the regions of a semiconductor substrate (film to be processed) according to the sixth embodiment.

FIG. 13 is a flowchart showing the CMP method according to this embodiment.

As shown in FIG. 13, CMP of the film (Cu film or W film) to be processed on the semiconductor substrate 10 starts in step S1. At this time, the temperature condition is adjusted by controlling cooling nozzles 28 such that the entrance temperature is 40° C. (inclusive) to 50° C. (inclusive), and the exit temperature is higher by 5° C. or more than the entrance temperature. That is, the temperature condition of the second embodiment is applied.

In step S2, the eddy-current sensor coil 113 generates an eddy current for the film to be processed, and detects it. The eddy current detection by the eddy-current sensor coil 113 is done in each of the partitioned regions of the semiconductor substrate 10 (film to be processed). More specifically, as shown in (a) of FIG. 14, the orbit X of the eddy-current sensor coil 113 that passes through the center O' of the semiconductor substrate 10 is partitioned into three regions, that is, the center region at the center of the semiconductor substrate 10, the middle region around (on both sides of) the center region, and the edge region around (on both sides of) the middle region. The eddy current is detected in each of these regions. This results from the arrangement of the center bag 124, the middle tube 125, and the edge tube 126 of the top ring 23.

In step S3, the film thickness measurement unit 114 measures the film thickness of the film to be processed for each region based on the eddy current generated and detected by the eddy-current sensor coil 113. At this time, the measured film thicknesses of the film to be processed are averaged for each region and monitored, as shown in (b) of FIG. 14.

In step S4, it is determined whether to end the CMP of the film to be processed. More specifically, it is determined whether the film to be processed has been polished to a desired film thickness in each region.

If the film to be processed has not reached the desired film thickness in step S4, the controller 115 adjusts, in step S5, the polishing load on the semiconductor substrate 10 (film to be processed) attached to the top ring 23 based on the film thickness of the film to be processed in each region measured by the film thickness measurement unit 114.

More specifically, the controller 115 increases the polishing load in a region with a larger film thickness, or decreases the polishing load in a region with a smaller film thickness. That is, the controller 115 compensates for a partial polishing delay on the film to be processed to control the polishing load in each region so that the film to be processed is uniformly polished in all regions (three regions in this embodiment). In other words, the polishing load in each region is controlled to make the timings to remove the film to be processed coincident with each other. In this way, the CMP process is performed while feeding back the polishing load in each region based on the film thickness measured in each region. After that, in step S2, the eddy-current sensor coil 113 generates an eddy current for the film to be processed, and detects it. That is, the film thickness is measured again.

On the other hand, if the film to be processed has reached the desired film thickness in step S4, the CMP process ends.

[Effects]

According to the sixth embodiment, adjustment is done by controlling the cooling nozzles 28 such that the entrance temperature is 40° C. (inclusive) to 50° C. (inclusive), and the exit temperature is higher by 5° C. or more than the entrance temperature. The film thickness of the film to be processed on the semiconductor substrate 10 is measured in each region, and the polishing load is adjusted for each region based on the film thickness. That is, the controller 115 controls the polishing load by feeding it back to uniformly polish the film to be processed during CMP. This allows to obtain the following effects.

Effects obtained by the system according to this embodiment which feeds back the polishing load will be described first with reference to FIGS. 15A and 15B.

Figures 15A, 15B:
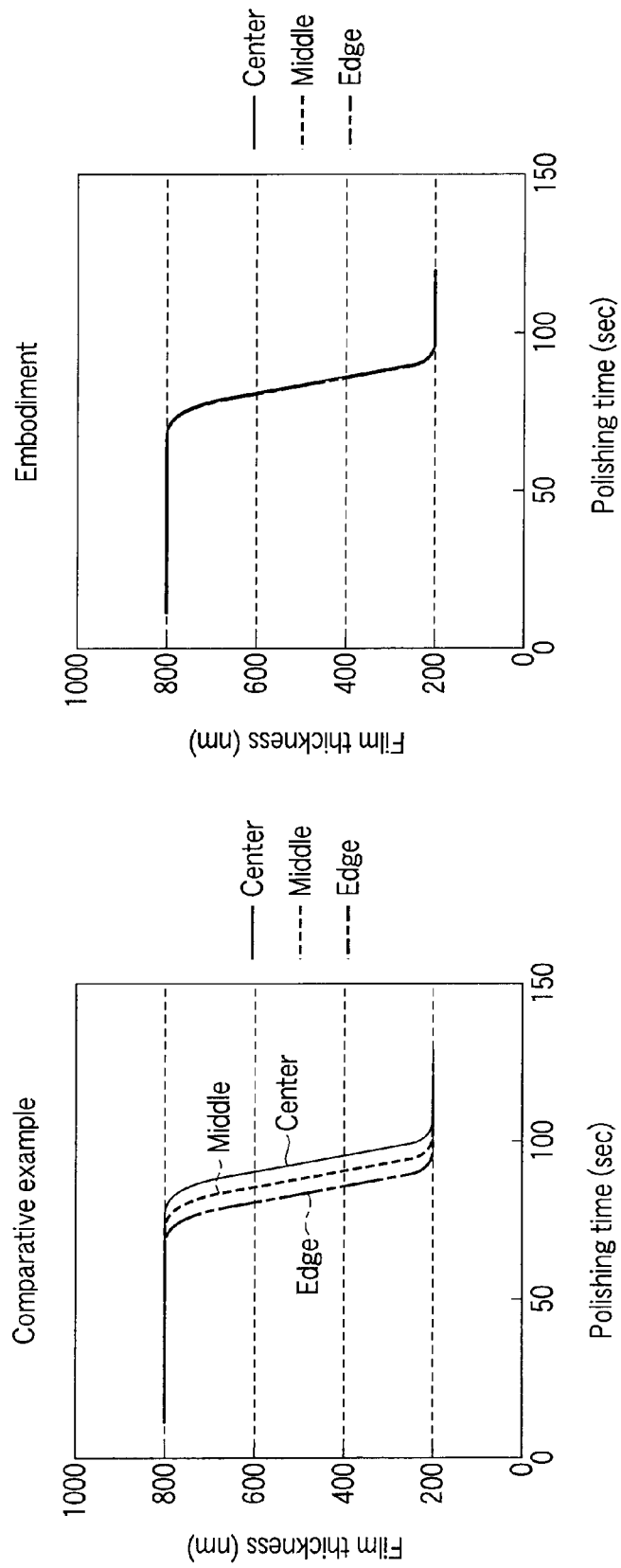
FIG. 15A is a graph showing a comparative example of the relationship between the film thickness and the polishing time upon CMP of the respective regions of the film to be processed according to the sixth embodiment.
FIG. 15B is a graph showing the relationship between the film thickness and the polishing time in CMP of the respective regions of the film to be processed according to the sixth embodiment.

FIG. 15A is a graph showing a comparative example of the relationship between the film thickness and the polishing time upon CMP of the respective regions (the center region, the middle region, and the edge region) of the film to be processed according to this embodiment. FIG. 15B is a graph showing the relationship between the film thickness and the polishing time in CMP of the respective regions of the film to be processed according to this embodiment. More specifically, FIG. 15A shows a comparative example in which the polishing load of each region remains constant without being adjusted.

As shown in FIG. 15A, according to the comparative example, the polishing time of the film to be processed changes between the regions. More specifically, the polishing time increases in the order of the edge region, the middle region, and the center region. For this reason, the polishing time equals the time up to the end of polishing of the center region where the polishing rate is lowest. In Experiments 15 and 17 of the second embodiment, the polishing times were 110 sec and 118 sec, respectively.

According to this embodiment, however, since the polishing load is adjusted to uniformly polish the film to be processed, the polishing time of the film to be processed is almost the same in all regions, as shown in FIG. 15B. As described above, when the polishing load is increased in the region with a low polishing rate to uniform the film thickness, the polishing time can be shortened. More specifically, in Experiments 15 and 17 of the second embodiment, the polishing times were 104 sec and 109 sec, respectively. The time can be shorter by about 5% than in the case (comparative example) without polishing load control. In addition, uniforming the film thickness of the film to be processed allows to suppress variations in finishing and improve the CMP characteristics.

Effects of temperature control (condition control of the second embodiment) by the cooling nozzles 28 when using the system will be described next with reference to FIGS. 16A and 16B.

FIG. 16A is a graph showing the relationship between the polishing rate and the polishing load in CMP of a W film according to this embodiment and its comparative example. FIG. 16B is a graph showing the relationship between the polishing rate and the polishing load in CMP of a Cu film according to this embodiment and its comparative example. More specifically, FIGS. 16A and 16B show comparative examples in which the polishing load is changed without temperature control by the cooling nozzles 28.

As shown in FIGS. 16A and 16B, according to the comparative examples, as the polishing load increases, the rate of rise of the polishing rate (removal rate) of the film to be processed changes near 300 [hPa]. More specifically, as shown in FIG. 16A, in CMP of the W film, the rate of rise of the polishing rate lowers, and the gradient becomes smaller from near 300 [hPa]. In addition, as shown in FIG. 16B, in CMP of the Cu film, the rate of rise of the polishing rate lowers, and the polishing rate itself also lowers from near 300 [hPa].

This assumed to take place due to the following reason.

Without temperature control by the cooling nozzles 28, as the polishing load increases, the surface temperatures of a polishing pad 21 and the film to be processed rise. This increases the oxidizing power (oxidation cycle speed) of the film to be processed. Accordingly, the components of the slurry oxidize, and a monomer changes into a polymer. At this time, when the surface temperature of the polishing pad 21 is 40° C. (inclusive) to 50° C. (inclusive), as in the second embodiment, the protective film formation agent adequately polymerizes, and silica contained in a slurry 24 easily polishes the surface of the film to be processed, thereby increasing the polishing force, as described above. However, if the temperature further rises (the comparative examples of FIGS. 16A and 16B), the protective film formation agent further polymerizes to form a dense film. Hence, polishing force of the slurry 24 decreases, and the polishing rate lowers.

On the other hand, according to this embodiment, the cooling nozzles 28 control the surface of the polishing pad 21 to 40° C. (inclusive) to 50° C. (inclusive). For this reason, the above-described problem does not arise even if the polishing load increases. That is, the polishing rate and the polishing load tend to be proportional, and the gradient is large, as compared to the comparative examples. When the polishing rate and the polishing load have a linear proportional relationship with a large gradient, the response of the polishing rate to the polishing load can be improved in the system.

That is, making the gradient of the relationship between the polishing rate and the polishing load larger enables to increase the polishing rate by slightly changing the polishing load. At this time, the gradient of the relationship between the polishing rate and the polishing load is preferably 50 [nm/min]/50 [hPa] or more. This can be implemented by the embodiment. In addition, when the polishing rate and the polishing load tend to be proportional, the polishing rate can easily be controlled by the polishing load. It is consequently possible to further shorten the polishing time and improve the CMP characteristics.

Note that an example has been described in this embodiment in which the system for feeding back the polishing load is applied to the temperature condition of the second embodiment. However, the present invention is not limited to this.

Application to the temperature condition of the first embodiment (the entrance temperature is 30° C. or less, and the exit temperature is higher by 5° C. or more than the entrance temperature) makes it possible to shorten the polishing time and improve the CMP characteristics by uniforming the surface of the film to be processed.

Additionally, in this embodiment, the film thickness of a Cu film or a W film is measured by detecting an eddy current using an eddy-current sensor. However, the present invention is not limited to this. When performing CMP of an insulating film (e.g., the silicon oxide film of the fifth embodiment) other than a metal film in which no eddy current is generated, the film thickness can be measured using an optical sensor or a microwave sensor in place of the eddy-current sensor.

That is, the system for feeding back the polishing load according to this embodiment is applicable to the first and second polishing steps of CMP of the first and second embodiments and that of the third to fifth embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device manufacturing method comprising:
   polishing a film on a semiconductor substrate by pressing the film against a polishing pad which rotates in a predetermined direction,
   wherein polishing the film to be processed comprises
   performing a first polishing in which an entrance temperature of the polishing pad is adjusted to be equal to or higher than 40° C. and be equal to or lower than 50° C., and an exit temperature of the polishing pad is adjusted to be higher by 5° C. or more than the entrance temperature, the entrance temperature being a temperature of a surface of the polishing pad on an upstream side in the rotational direction of the polishing pad from the film pressed on the polishing pad, and the exit temperature being a temperature of a surface of the polishing pad on a downstream side in the rotational direction of the polishing pad from the film pressed on the polishing pad, and
   performing a second polishing in which the entrance temperature is adjusted to be equal to or lower than 30° C., and the exit temperature is adjusted to be higher by 5° C. or more than the entrance temperature.

2. The method of claim 1, wherein the first polishing is switched to the second polishing when a thickness of the film is equal to or thicker than 50 nm.

3. The method of claim 1, wherein when performing the first polishing and the second polishing,
   the film is partitioned into regions, and a thickness of the film is measured in each of the regions, and
   a polishing load to the film is adjusted in each of the regions based on the thickness of the film measured in each of the regions.

4. The method of claim 3, wherein a gradient of a relationship between the polishing load to the film and a polishing rate of the film is equal to or more than 50 [nm/min]/50 [hPa].

5. The method of claim 1, wherein when switching the first polishing to the second polishing, the entrance temperature is adjusted by supplying pure water.

6. The method of claim 1, wherein the entrance temperature and the exit temperature are temperatures of the polishing pad on a circular orbit passing through a center of the semiconductor substrate and having a predetermined distance from a rotational axis of the polishing pad.

7. The method of claim 6, wherein the entrance temperature and the exit temperature are temperatures of the polishing pad in a position at a predetermined distance from the semiconductor substrate.

8. The method of claim 1, wherein the exit temperature is adjusted by controlling a polishing load between the semiconductor substrate and the polishing pad.

9. The method of claim 1, further comprising:
   before polishing the film to the processed,
   forming an insulating film on the semiconductor substrate,
   forming a trench in the insulating film, and
   forming a metal film in the trench and on the insulating film outside the trench,
   wherein the film is the metal film formed outside the trench.

10. The method of claim 1, further comprising:
    before polishing the film,
    forming an STI pattern in the semiconductor substrate, and
    forming an insulating film in the STI pattern and on the semiconductor substrate outside the STI pattern,
    wherein the film is the insulating film formed outside the STI pattern.

11. A semiconductor device manufacturing method comprising:
    polishing a film on a semiconductor substrate by pressing the film against a polishing pad which rotates in a predetermined direction,
    wherein polishing the film to be processed comprises
    adjusting an entrance temperature of the polishing pad to be equal to or lower than 30° C., and adjusting an exit temperature of the polishing pad to be higher by 5° C. or more than the entrance temperature, the entrance temperature being a temperature of a surface of the polishing pad on an upstream side in the rotational direction of the polishing pad from the film pressed on the polishing pad, and the exit temperature being a temperature of a surface of the polishing pad on a downstream side in the rotational direction of the polishing pad from the film pressed on the polishing pad.

12. The method of claim 11, wherein when polishing the film,
    the film is partitioned into regions, and a thickness of the film is measured in each of the regions, and
    a polishing load to the film is adjusted in each of the regions based on the thickness of the film measured in each of the regions.

13. The method of claim 12, wherein a gradient of a relationship between the polishing load to the film and a polishing rate of the film is equal to or more than 50 [nm/min]/50 [hPa].

14. The method of claim 11, wherein the entrance temperature and the exit temperature are temperatures of the polishing pad on a circular orbit passing through a center of the semiconductor substrate and having a predetermined distance from a rotational axis of the polishing pad.

15. The method of claim 11, further comprising:
    before polishing the film to be processed,
    forming an insulating film on the semiconductor substrate,
    forming a trench in the insulating film, and forming a metal film in the trench and on the insulating film outside the trench,
wherein the film is the metal film formed outside the trench.

16. A semiconductor device manufacturing method comprising:
polishing a film on a semiconductor substrate by pressing the film against a polishing pad which rotates in a predetermined direction,
wherein polishing the film to be processed comprises
adjusting an entrance temperature of the polishing pad to be equal to or higher than 40° C. and be equal to or lower than 50° C., and adjusting an exit temperature of the polishing pad to be higher by 5° C. or more than the entrance temperature, the entrance temperature being a temperature of a surface of the polishing pad on an upstream side in the rotational direction of the polishing pad from the film pressed on the polishing pad, and the exit temperature being a temperature of a surface of the polishing pad on a downstream side in the rotational direction of the polishing pad from the film pressed from the film pressed on the polishing pad.

17. The method of claim 16, wherein when polishing the film,
the film is partitioned into regions, and a thickness of the film is measured in each of the regions, and
a polishing load to the film is adjusted in each of the regions based on the thickness of the film measured in each of the regions.

18. The method of claim 17, wherein a gradient of a relationship between the polishing load to the film and a polishing rate of the film is equal to or more than 50 [nm/min]/50 [hPa].

19. The method of claim 16, wherein the entrance temperature and the exit temperature are temperatures of the polishing pad on a circular orbit passing through a center of the semiconductor substrate and having a predetermined distance from a rotational axis of the polishing pad.

20. The method of claim 16, further comprising:
before polishing the film to be processed,
forming an insulating film on the semiconductor substrate,
forming a trench in the insulating film, and
forming a metal film in the trench and on the insulating film outside the trench,
wherein the film is the metal formed outside the trench.

* * * * *

UNITED STATES PATENT AND TRADEMARK OFFICE
CERTIFICATE OF CORRECTION

PATENT NO. : 8,575,030 B2
APPLICATION NO. : 13/196594
DATED : November 5, 2013
INVENTOR(S) : Minamihaba et al.

It is certified that error appears in the above-identified patent and that said Letters Patent is hereby corrected as shown below:

In the Claims

Claim 9, column 22, line 18, change "to the processed" to --to be processed--.

Signed and Sealed this
Fourth Day of March, 2014

Michelle K. Lee
*Deputy Director of the United States Patent and Trademark Office*